(12) United States Patent
Dong et al.

(10) Patent No.: US 10,732,228 B2
(45) Date of Patent: Aug. 4, 2020

(54) ESTIMATING CONDITION OF BATTERY, RELATED SYSTEM AND VEHICLE

(71) Applicant: Utopus Insights, Inc., Valhalla, NY (US)

(72) Inventors: Jin Dong, Beijing (CN); Carlton Gammons, Beijing (CN); Jin Yan Shao, Beijing (CN); Qi Ming Tian, Beijing (CN); Ming Xie, Beijing (CN); Wen Jun Yin, Beijing (CN); Hong Guang Yu, Beijing (CN); Li Li Zhao, Beijing (CN)

(73) Assignee: Utopus Insights, Inc., Valhalla, NY (US)

( * ) Notice: Subject to any disclaimer, the term of this patent is extended or adjusted under 35 U.S.C. 154(b) by 572 days.

(21) Appl. No.: 14/168,041

(22) Filed: Jan. 30, 2014

(65) Prior Publication Data
US 2014/0214349 A1 Jul. 31, 2014

(30) Foreign Application Priority Data
Jan. 31, 2013 (CN) .......................... 2013 1 0037817

(51) Int. Cl.
*G01R 31/392* (2019.01)
*G01R 31/367* (2019.01)

(52) U.S. Cl.
CPC ......... *G01R 31/392* (2019.01); *G01R 31/367* (2019.01)

(58) Field of Classification Search
None
See application file for complete search history.

(56) References Cited

U.S. PATENT DOCUMENTS 5,525,890 A * 6/1996 Iwatsu ............... G01R 31/3648
320/106
7,411,373 B2 8/2008 Tashiro et al.
(Continued)

FOREIGN PATENT DOCUMENTS

CN 101641606 A 2/2010
CN 102213747 A 10/2011
(Continued)

OTHER PUBLICATIONS

Electric Vehicles, "Easy battery integration and exchange in electric vehicles", EASYBAT, pp. 1-14, Project EOS-LT NEO Program (Energy Research Subsidy, Long-Term, New Energy Development), Jan.-Dec. 2010.
(Continued)

*Primary Examiner* — Alexander Satanovsky
*Assistant Examiner* — Brent A. Fairbanks
(74) *Attorney, Agent, or Firm* — Ahmann Kloke LLP (57) ABSTRACT

An apparatus for estimating a condition of a battery includes a mode identifying unit configured to identify a usage mode of the battery during a period of time and its corresponding attenuation curve, according to recorded data on battery usage, stored usage modes of the battery and attenuation curves corresponding to the various usage modes, the attenuation curve representing a change of a fully charged capacity of the battery with battery usage; and a condition estimating unit configured to calculate battery degradation according to the recorded data, the identified usage mode and its corresponding attenuation curve, the degradation representing a quantity of the fully charged capacity of the battery that is reduced over the battery usage. The condition of the battery is estimated so as to rationally judge the residual value of the battery in operation.

20 Claims, 6 Drawing Sheets

(56) References Cited

U.S. PATENT DOCUMENTS

| | | | |
|---|---|---|---|
| 7,525,288 B2 | 4/2009 | Tashiro et al. | |
| 7,615,963 B2 | 11/2009 | Tashiro et al. | |
| 8,108,161 B2 | 1/2012 | Tomura et al. | |
| 8,146,694 B2 | 4/2012 | Hamidi | |
| 8,193,770 B2 | 6/2012 | Zheng et al. | |
| 2003/0016023 A1* | 1/2003 | Richter | G01F 1/06 324/427 |
| 2004/0017180 A1 | 1/2004 | Cook | |
| 2004/0027093 A1 | 2/2004 | Tashiro et al. | |
| 2005/0017725 A1* | 1/2005 | Murakami | B60L 3/0046 324/426 |
| 2005/0225296 A1 | 10/2005 | Tashiro et al. | |
| 2005/0225297 A1 | 10/2005 | Tashiro et al. | |
| 2005/0225298 A1 | 10/2005 | Tashiro et al. | |
| 2008/0007221 A1* | 1/2008 | Lee | G01R 31/3648 320/128 |
| 2010/0036628 A1* | 2/2010 | Plestid | G01R 31/3679 702/63 |
| 2010/0121591 A1* | 5/2010 | Hall | G01R 31/3651 702/63 |
| 2010/0145837 A1 | 6/2010 | Graziano et al. | |
| 2010/0153038 A1 | 6/2010 | Tomura et al. | |
| 2010/0201323 A1* | 8/2010 | Okamura | H02J 7/0072 320/134 |
| 2010/0292877 A1 | 11/2010 | Lee | |
| 2011/0066309 A1 | 3/2011 | Matsuoka et al. | |
| 2012/0005125 A1 | 1/2012 | Jammer | |
| 2012/0101755 A1 | 4/2012 | Hirasawa | |
| 2012/0120983 A1 | 5/2012 | Henkel | |
| 2012/0191385 A1 | 7/2012 | Mitsui et al. | |
| 2012/0262126 A1 | 10/2012 | Boehm et al. | |
| 2012/0274268 A1* | 11/2012 | Ishida | H02J 3/14 320/107 |
| 2013/0030739 A1* | 1/2013 | Takahashi | G01R 31/3658 702/63 |
| 2013/0204560 A1* | 8/2013 | Lo | G01R 31/361 702/63 |
| 2013/0249276 A1* | 9/2013 | Rovik | B60L 3/12 307/9.1 |

FOREIGN PATENT DOCUMENTS

| | | |
|---|---|---|
| CN | 102221675 A | 10/2011 |
| CN | 102445663 A | 5/2012 |
| CN | 102608542 A | 7/2012 |
| CN | 102621497 A | 8/2012 |
| CN | 102798823 A | 11/2012 |
| CN | 103969585 A | 8/2014 |
| DE | 102010048187 | 4/2012 |
| DE | 102012006964 A1 | 11/2012 |
| EP | 2639096 | 9/2013 |
| GB | 2525542 A | 10/2015 |
| JP | 08140205 A | 5/1996 |
| JP | 2000012105 A | 1/2000 |
| JP | 2003092836 A | 3/2003 |
| JP | 2004014205 A | 1/2004 |
| JP | 2006197765 A | 7/2006 |
| JP | 2008126788 A | 6/2008 |
| JP | 2011064471 A | 3/2011 |
| JP | 2012046171 A | 3/2012 |
| JP | 2016513241 A | 5/2016 |
| WO | 2011160258 A1 | 12/2011 |
| WO | 2012055295 A1 | 5/2012 |
| WO | 2012063606 A1 | 5/2012 |
| WO | 2014117643 A1 | 8/2014 |

OTHER PUBLICATIONS

Electropaedia, "Battery Management Systems (BMS)", http://ww.mpoweruk.com/bms.htm, accessed on Jan. 21, 2014.

National Aeronautics and Space Administration, "Battery Monitoring system Logs, Processes, and Transmits Sensor Data Wirelessly", www.nasa.gov.

International Search Report and Written Opinion for Application No. PCT/CN2014/070291, filed on Jan. 8, 2014.

* cited by examiner

FIG. 6 identifying a usage mode of the battery during a period of time and finding an attenuation curve corresponding to the usage mode, according to the real-time recorded data on battery usage and stored usage modes of the battery and attenuation curves corresponding to the various usage modes.
S1 calculating battery degradation according to the recorded data, the identified usage mode and its corresponding attenuation curve, the degradation representing a quantity of the fully charged capacity of the battery that is reduced over the battery usage.
S2

FIG. 9 search for a discharging mode m matching the depth of discharge d and temperature T.
S301 according to an attenuation curve f corresponding to the mode m, calculate a slope s of the attenuation curve f at a point $c=c_a$.
S302 calculate the fully charged capacity $c_b$ of the battery at the time $t_b$.
S303

ESTIMATING CONDITION OF BATTERY, RELATED SYSTEM AND VEHICLE

CROSS REFERENCE TO RELATED APPLICATIONS

The present application claims the benefit of priority of Chinese Patent Application Serial Number 2013-10037817.1, filed Jan. 31, 2013, with the Chinese Patent Office, the contents of which are herein incorporated by reference in their entirety.

This application claims the priority from the PCT Application Serial Number PCT/CN2014/070291, filed Jan. 8, 2014, with the State Intellectual Property Office of the People's Republic of China as the Receiving Office, the contents of which are herein incorporated by reference in their entirety.

FIELD OF THE INVENTION

The present invention relates to a method and apparatus for estimating condition of a battery, and a related system and vehicle, and more specifically, to a method and apparatus for estimating condition of a battery by using recorded data on battery usage and a pre-established mode table, and a related system and vehicle.

BACKGROUND

Battery charging of an electric vehicle is slow and has high cost with vigorous development of the automotive industry. At present, there are primarily two operating modes of the electric vehicle: plug-in battery charging and battery swapping.

One is plug-in charging mode, that is, the user purchases the electric vehicle including a battery and charges the battery in a charging station or charging pole provided by an operator. Under this charging mode, the user may select slow charging or fast charging by himself/herself as needed. The former has a longer duration but a lower rate whereas the latter has a shorter duration but a higher rate. Charging facilities for the two types of charging are operated by the operators. The operator bills the user according to the electricity consumed during charging. However, after such a charging, the electricity energy discharged by the battery when in use is always less than the electricity energy consumed during the charging process, and a difference between the two depends on the condition of the battery. That is to say, for a given battery with different condition, in the case that the same electricity energy is consumed, a different battery can discharge different electricity energy when in use. Therefore, billing the user only according to the electricity energy consumed during the charging is irrational.

The other one is battery swap mode, that is, the consumer purchases the electric vehicle without the battery but rents or leases the battery from a battery operator, and the user pays by a driving distance of the current battery. However, the driving distance cannot sufficiently reflect the condition of the battery, because it fails to take battery degradation caused by a different usage mode into full consideration and cannot effectively suppress abuse of battery. For example, in two cases where the battery drives the same distance, namely, driven with a heavy load and driven without load, or driven while climbing and driven on flat road, or driven with a variable speed and driven with a uniform speed, battery degradation is different in different cases. Therefore, it is also irrational to bill the user only based on the driving distance.

Therefore, there needs a technique to correctly estimate the condition of the battery, e.g., the degradation degree of the battery, the remaining quantity of electricity energy of the battery, so as to rationally judge a residual value of the battery for the convenience of rational billing.

SUMMARY

One object of the invention is to improve the prior art to provide a novel method and apparatus for estimating a condition of a battery.

According to one embodiment of the present invention, an apparatus is provided for estimating a condition of a battery, comprising: a mode identifying unit configured to identify a usage mode of the battery during a period of time and its corresponding attenuation curve, according to recorded data on battery usage, stored usage modes of the battery and attenuation curves corresponding to the various usage modes, the attenuation curve representing a change of a fully charged capability of the battery over battery usage; and a condition estimating unit configured to calculate degradation of the battery according to the recorded data and the identified usage mode and its corresponding attenuation curve, the degradation representing a quantity of the fully charged capacity of the battery that is reduced over the battery usage.

According to another embodiment of the present invention, a method is provided for estimating a condition of a battery, comprising: identifying a usage mode of the battery during a period of time and a corresponding attenuation curve, according to recorded data on battery usage, stored usage modes of the battery and attenuation curves corresponding to the various usage modes, the attenuation curve representing a change of a fully charged capacity of the battery over battery usage; and calculating battery degradation according to the recorded data and the identified usage mode and its corresponding attenuation curve, the degradation representing a quantity of the fully charged capacity of the battery that is reduced over the battery usage.

The invention further provides a system comprising the apparatus of the invention.

The invention further provides a vehicle comprising the apparatus of the invention.

According to an aspect of the invention, the condition of the battery can be correctly estimated so as to more rationally judge the residual value of the battery, and to be better adapted to requirements such as rational billing and predicting a drivable distance/duration.

BRIEF DESCRIPTION OF THE SEVERAL VIEWS OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, establish means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instruction means which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 1:
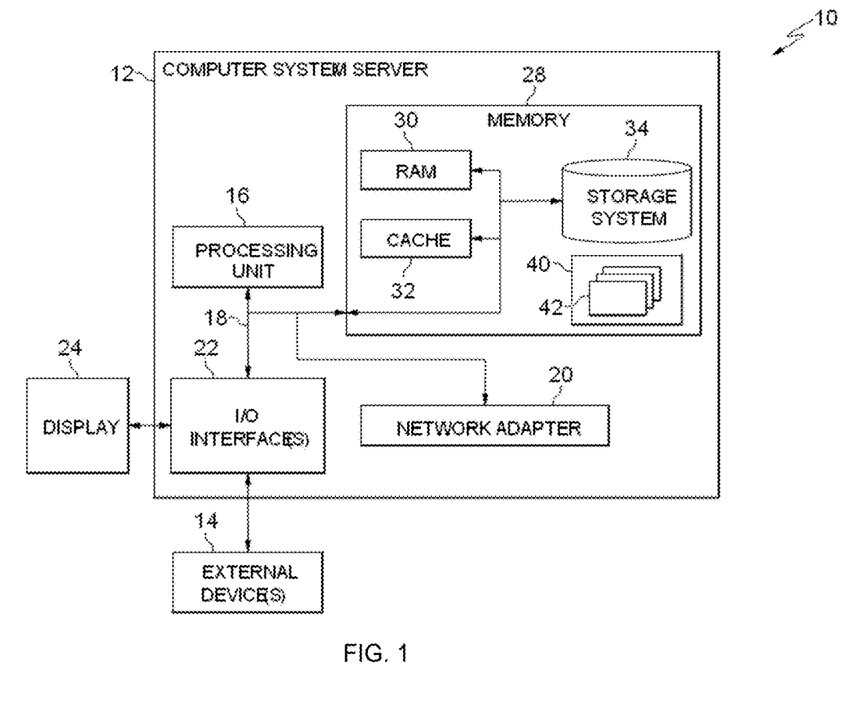
FIG. 1 is a block diagram showing an exemplary computer system/server which is applicable to implement the embodiments of the present invention.

Referring now to FIG. 1, in which an exemplary computer system/server 12 which is applicable to implement the embodiments of the present invention is shown. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
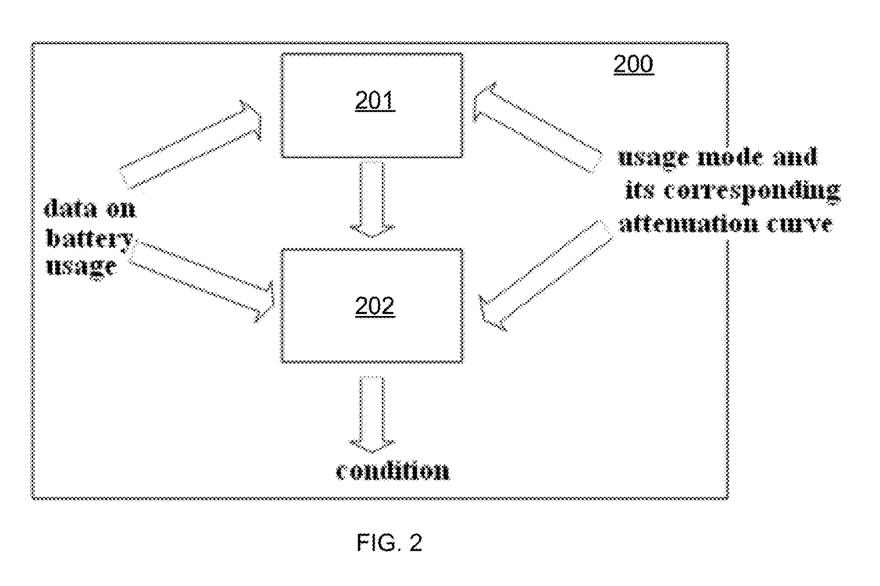
FIG. 2 is a block diagram showing an apparatus for estimating a condition of a battery according an exemplary embodiment of the present invention.

With reference now to FIG. 2, a block diagram of an apparatus 200 for estimating a condition of the battery according to an exemplary embodiment of the present invention is shown.

The apparatus 200 for estimating a condition of the battery according to an exemplary embodiment of the present invention comprises: a mode identifying unit 201 configured to identify a usage mode of the battery during a period of time and its corresponding attenuation curve, according to recorded data on battery usage, stored usage modes of the battery and attenuation curves corresponding to the various usage modes, the attenuation curve f representing a change of a fully charged capacity of the battery over the battery usage; and a condition estimating unit 202 configured to calculate battery degradation according to the recorded data, the identified usage mode and its corresponding attenuation curve, the degradation representing a quantity of the fully charged capacity of the battery that is reduced over the battery usage.

Besides the electric vehicle, the apparatus for estimating a condition of the battery can be mounted on or coupled with other apparatuses that use a battery.

The usage modes of the battery and the attenuation curves corresponding to the usage modes can be stored in various storage mediums. For example, they can be stored in a mode table {M} or other databases. The usage modes of the battery comprise a charging mode, an idle mode and a discharging mode.

The degradation of the battery can be embodied in that the fully charged capacity of the battery is reduced over the battery usage, wherein the fully charged capacity of the battery generally refers to a discharging capacity of the battery which is discharged to a standard cut-off voltage $U_t$ according to a particular discharging mode, in the case of a full charge. The standard cut-off voltage $U_t$ is a fixed value associated with the electrode material of a lithium-ion battery, generally 2.75V. The full charge of the battery for example may be the case where the battery is charged to the standard limit voltage which generally is 4.2V for a lithium-ion battery.

The embodiment will be described below by taking a lithium-ion battery for example.

Data on battery usage can be recorded in real time, comprising: start time and end time of battery usage, initial voltage and final voltage of battery usage, charge current, charge level, temperature, discharge current, idle time, and depth of discharge representing electricity energy of the battery before idle. With regard to charging, the start time and end time of battery usage are start time and end time of the charging. With regard to discharging, the start time and end time of battery usage are start time and end time of the discharging. There are generally three kinds of charge levels, namely, Level I, Level II, Level III, and specific voltage and current specifications are different in different countries.

As an example, Mode tables $\{M_c\}$, $\{M_d\}$ and $\{M_i\}$ of the charging mode, discharging mode and idle mode can be established respectively according to experimental data of a particular type of lithium battery (positive electrode, negative electrode, electrolyte material). The charging mode table $\{M_c\}$, discharging mode table $\{M_d\}$ and idle mode table $\{M_i\}$ can be collectively referred to as mode table $\{M\}$.

Suppose that the charging mode can be determined by charge level L, charging capacity δe, temperature T and final voltage U. Attenuation curves of the battery in different charge level L-final voltage U-charging capacity δe-temperature T modes can be obtained according to the following example.

For example, suppose that the factory capacity of the battery is $c_0$. Discharge an unused battery just leaving the factory according to a standard discharging mode of 1C, and record a discharging capacity $E_0$ that the battery is discharged from a certain voltage to the standard cut-off voltage, where C represents a ratio of current during charging and discharging. Completing discharging of the capacity of the battery within 1 hour is referred to as 1C standard discharging mode. By using a charging device of a charge level, the battery is charged from the standard cut-off voltage to the above certain voltage (i.e., final charging voltage) at a temperature, a charging capacity is recorded, and then the battery is discharged according to the 1C standard discharging mode to the standard cut-off voltage, and a discharging capacity is recorded. Charging and discharging the battery once is called a cycle. Repeat the above process a number of cycles and perform the corresponding data process, and obtain the condition of the battery after the number of cycles. The charging capacity and the discharging capacity can be obtained by respectively calculating an integral of charge current and discharge current with respect to time.

For a certain final charging voltage, suppose that in the first cycle, the discharging capacity of the battery which is discharged from the final charging voltage to the standard cut-off voltage is $E_1$. After the first cycle, the fully charged capacity of the battery is $$c_1 = c_0 \cdot \frac{E_1}{E_0}.$$

Similarly, after the second cycle, the fully charged capacity of the battery is $$c_2 = c_1 \cdot \frac{E_2}{E_1}.$$

And so on, after n+1 (n is a positive integer) cycles, the fully charged capacity of the battery in the charging mode is $$c_{n+1} = c_n \cdot \frac{E_{n+1}}{E_n}.$$

In practice, for example, let n be 500, then a relation curve f between the fully charged capacity of the battery (vertical axis) and the number of cycles (horizontal axis) in the charging mode can be obtained.

By calculating an average value of the charging capacities recorded in the number of cycles, a charging capacity required to discharge the battery from the standard cut-off voltage to the final voltage can be obtained. It should be noted that, even in the case of the same charge level, final voltage and temperature, a different charging capacity corresponds to a different charging mode. For example, in 25° C., the battery is charged from the standard cut-off voltage to 4.35 V by using the charge level I. If the charging stops during a linear rising stage of the voltage over time, the consumed charging capacity is for example 3.20 ampere-hour (Ah); if the battery is charged with a constant voltage for a period of time after the voltage reaches 4.35V, the consumed charging capacity is a value greater than 3.20 Ah, e.g., 3.30 Ah. The above two cases will be regarded as corresponding different charging modes.

Figure 3:
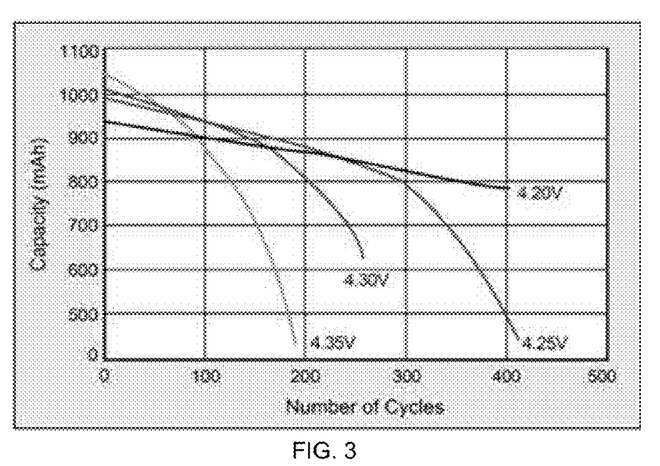
FIG. 3 shows attenuation curves in a charging mode according an exemplary embodiment of the present invention.

As an example, for charge level I, temperature 25° C., respectively selecting final voltages 4.35V, 4.30V, 4.25V, 4.20V . . . , results in the attenuation curves shown in FIG. 3.

It can be seen from FIG. 3 that, in the case of the final charging voltage 4.35V, the fully charged capacity of the battery is reduced rapidly with the increase of the number of cycles, and is dropped to almost zero after the number of cycles of less than 200. However, in the case of the final charging voltage of 4.20V, the fully charged capacity of the battery is only reduced by 20% or so even if the number of cycles is up to 400. Suppose that the degradation s of the battery is defined for example as a rate of change of the fully charged capacity of the battery with the number of cycles. It can be seen that the degradation s of the battery continuously increases with the increase of the final charging voltage from 4.20V to 4.35V.

By selecting different parameters for the above process, the mode table $\{M_c\}$ in various charging modes can be obtained as shown in for example Table 1.

TABLE 1 charging mode table

| Charge level | Final voltage | Charging capacity | Temperature | Curve |
|---|---|---|---|---|
| Level I | 4.35 V | 3.20 Ah | 25° C. | C = $f_1(n)$ |
| Level I | 4.30 V | 3.12 Ah | 25° C. | C = $f_2(n)$ |
| Level I | 4.25 V | 3.05 Ah | 25° C. | C = $f_3(n)$ |
| Level I | 4.20 V | 3.00 Ah | 25° C. | C = $f_4(n)$ |
| . . . | . . . | . . . | . . . | . . . |

Consequently, other values can be selected as needed for the scales of the parameters, and theoretically, the smaller the scale, the more accurate. However, by taking sampling quantity into consideration, a larger scale can be selected so long as different modes can be effectively distinguished. For example, the scale of the final voltage can be selected as 0.1V or others, so long as various modes can be effectively distinguished.

A discharging mode table according to an exemplary embodiment of the present invention will be described below in combination with FIGS. 4 and 5 and Table 2.

Suppose that the discharging mode can be determined by discharge current $I_d$, temperature T and discharge initial voltage $U_a$. Attenuation modes in different discharge current-discharge initial voltage-temperature modes can be obtained according to the following example. The discharge current may contain a plurality of properties, e.g., type (DC, AC or pulsed), discharge rate, discharge frequency.

For example, charge the battery to its charging limit voltage by means of the 1C standard charging mode, discharge the battery with a current of a type and a value to the standard cut-off voltage, and record a discharging capacity when the voltage is dropped to each voltage scale. Charging the battery constantly with a current used in the 1C standard discharging mode is called a 1C standard charging mode. Then charge the battery from the standard cut-off voltage to the charging limit voltage of the battery according to the 1C standard charging mode, and then repeat the above discharging process, which is a cycle of battery usage. Repeat the above process a number of times, and perform the corresponding data process, then the condition of the battery after the number of cycles can be obtained. Here, the charging limit voltage can be set as a voltage slightly higher than the standard limit voltage 4.2V, e.g., 4.35V, to take various situations in actual use into consideration and record more data points. The discharging capacity when the voltage is dropped to each voltage scale can be obtained by calculating an integral of discharge current with respect to time. Each voltage scale can be processed as an initial voltage of the discharging, and then the discharging capacities discharging from various initial voltages to the standard cut-off voltage can be obtained through simple calculations.

For an initial charging voltage, suppose that the discharging capacity of a battery just leaving the factory, which is discharged from the initial charging voltage to the standard cut-off voltage, is $E_0$, and in the first cycle, the discharging capacity of the battery, which is discharged from the initial charging voltage to the standard cut-off voltage, is $E_1$. After the first cycle, the fully charged capacity of the battery is $$c_1 = c_0 \cdot \frac{E_1}{E_0}.$$

Similarly, after the second cycle, the fully charged capacity of the battery is $$c_2 = c_1 \cdot \frac{E_2}{E_1}.$$

And so on, after n+1 (n is a positive integer) cycles, the fully charged capacity of the battery in the discharging mode is $$c_{n+1} = c_n \cdot \frac{E_{n+1}}{E_n}.$$

In practice, for example, let n be 300, then a relation curve f between the fully charged capacity of the battery (vertical axis) and the number of cycles (horizontal axis) in the discharging mode can be obtained.

Figure 4:
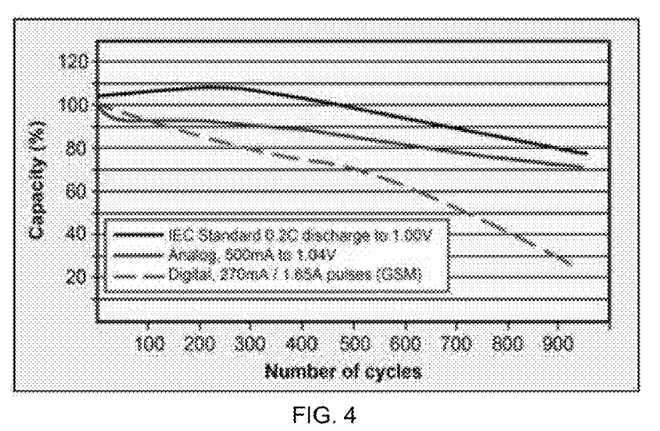
FIG. 4 shows attenuation curves in a discharging mode according an exemplary embodiment of the present invention.

FIG. 4 shows attenuation curves in the discharging mode according to an exemplary embodiment of the present invention, in which a change of the fully charged capacity of the battery with the number of cycles in the case of a different type of discharge current is shown. It can be seen from FIG. 4 that, in the case that the discharge current is a direct current, an impact to the fully charged capacity of the battery is the lowest, that is, even in the case of 900 cycles, the fully charged capacity of the battery is only reduced by about 20%; whereas, in the case that the discharge current is a pulsed current, the impact to the fully charged capacity of the battery is the highest, that is, also in the case of 900 cycles, the fully charged capacity of the battery is reduced by about 70%. Consequently, pulsed discharging degrades the battery much more than the direct current discharging.

Figure 5:
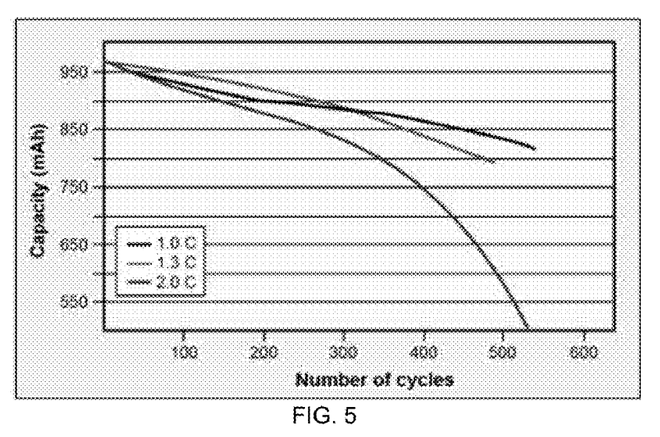
FIG. 5 shows attenuation curves in a charging mode according an exemplary embodiment of the present invention.

FIG. 5 shows attenuation curves in the discharging mode according to an exemplary embodiment of the present invention, in which a change of the fully charged capacity of the battery with the number of cycles in the case of a different value of discharge current is shown. It can be seen from FIG. 5 that, in the case that the discharge current is a direct current, after 300 cycles, the larger the discharge current, the higher the impact to the fully charged capacity of the battery; that is, the larger the battery degradation.

By selecting different parameters for the above process, a mode table $\{M_d\}$ in various discharging modes can be obtained as shown in for example Table 2.

TABLE 2 discharging mode table

| Current type | Discharge rate | Current frequency | Initial voltage | Temperature | Curve |
|---|---|---|---|---|---|
| Direct current | 1 C | — | 4.35 V | 20° C. | $C = f_1(n)$ |
| pulsed | 0.1 C/1 C | 100 Hz | 4.35 V | 20° C. | $C = f_2(n)$ |
| Direct current | 1 C | — | 4.30 V | 20° C. | $C = f_3(n)$ |
| pulsed | 0.1 C/1 C | 100 Hz | 4.30 V | 20° C. | $C = f_4(n)$ |
| . . . | . . . | . . . | . . . | . . . | . . . |

Suppose that the idle mode can be determined by temperature T, depth of discharge d and idle time H. Attenuation curves of the battery in different idle modes for several days (e.g., 10 days) can be obtained according to the following example.

For example, suppose that after the battery is discharged from the standard limit voltage to a depth of discharge by means of the 1C standard discharging mode, it is idle for a period of time in an environmental temperature. The battery is then discharged to the discharging cut-off voltage still according to the 1C standard discharging mode, and a discharging capacity (an integral of current with respect to time) is recorded. Then charge the battery from the standard cut-off voltage to the standard limit voltage according to the 1C standard charging mode, and then repeat the above discharging and idle processes, which is a cycle of battery usage. Repeat the above process a number of cycles and perform the corresponding data process to obtain the condition of the battery after the number of cycles is obtained. The discharging capacity can be obtained by calculating an integral of discharge current with respect to time.

For a certain depth of discharge, suppose that the discharging capacity of a battery just leaving the factory, which is discharged from the initial charging voltage to the standard cut-off voltage, is $E_0$, and in the first cycle, the recorded discharging capacity of the battery, which is discharged to the standard cut-off voltage after being idle from the initial charging voltage for the period of time, is $E_1$. After the first cycle, the fully charged capacity of the battery is $$c_1 = c_0 \cdot \frac{E_1}{E_0}.$$

Similarly, after the second cycle, the fully charged capacity of the battery is $$c_2 = c_1 \cdot \frac{E_2}{E_1}.$$

And so on, after n+1 (n is a positive integer) cycles, the fully charged capacity of the battery in the idle mode is $$c_{n+1} = c_n \cdot \frac{E_{n+1}}{E_n}.$$

In practice, for example, let n be 30, then a relation curve f between the fully charged capacity of the battery (vertical axis) and the number of cycles (horizontal axis) in the idle mode can be obtained.

Figure 6:
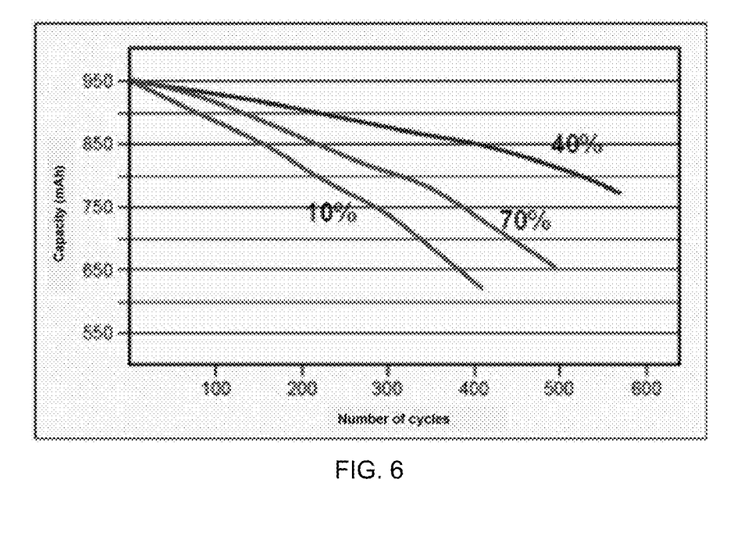
FIG. 6 shows attenuation curves in an idle mode according an exemplary embodiment of the present invention.

FIG. 6 shows attenuation curves in the idle mode according to an exemplary embodiment of the present invention, in which a change of the fully charged capacity of the battery with the number of cycles in the case of different depths of discharge before the battery is idle is shown. It can be seen from FIG. 6 that, in the case of the depth of discharge of 40%, the impact to the fully charged capacity of the battery is the lowest, and even if there are 400 cycles, the fully charged capacity of the battery is only reduced by about 11%. However, in the case of the depth of discharge of 10% and 70%, also after 400 cycles, the fully charged capacity of the battery is reduced by about 33% and 22%, respectively. That is to say, if it is likely to make the battery idle, a suitable depth of discharge can be selected so as to reduce battery degradation as far as possible.

By selecting different parameters for the above process, the mode table $\{M_i\}$ in various idle modes can be obtained as shown in for example Table 3.

TABLE 3

| | idle mode table | |
|---|---|---|
| temperature | Depth of discharge | curve |
| 25° C. | 80% | C = $f_1(n)$ |
| 25° C. | 75% | C = $f_2(n)$ |
| 25° C. | 70% | C = $f_3(n)$ |
| 25° C. | 65% | C = $f_4(n)$ |
| ... | | ... |

Figure 7:
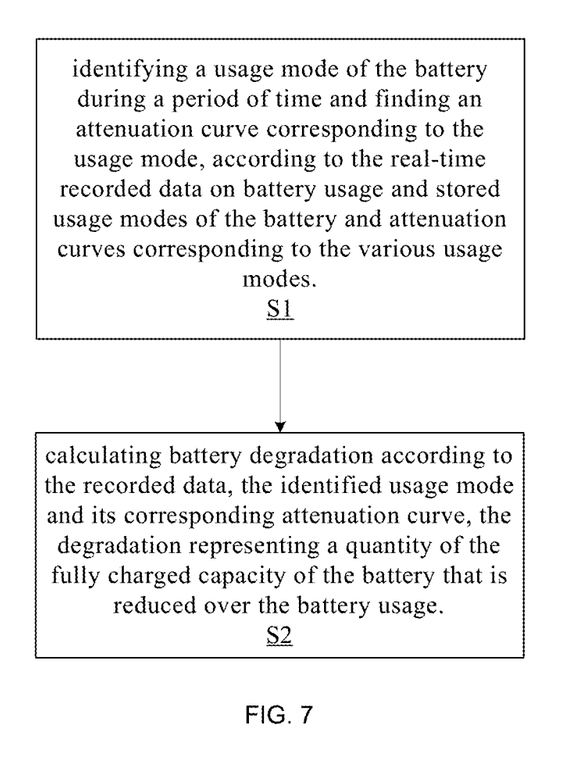
FIG. 7 is a flowchart showing a method for estimating a condition of a battery according an exemplary embodiment of the present invention.

By referring to the stored usage modes of the battery and attenuation curves corresponding to the usage modes, for example, by referring to the mode table {M} obtained as above, the mode identifying unit 201 identifies whether a usage mode of the battery during a period of time is a charging mode, a discharging mode or an idle mode according to the recorded data on battery usage, and finds in the mode table {M} an attenuation curve corresponding to the usage mode, as shown in a step S1 of FIG. 7.

Then, in a step S2, the condition estimating unit 202 calculates battery degradation according to the recorded data, the identified usage mode and its corresponding attenuation curve, the degradation representing a quantity of the fully charged capacity of the battery that is reduced over the battery usage.

Figure 8:
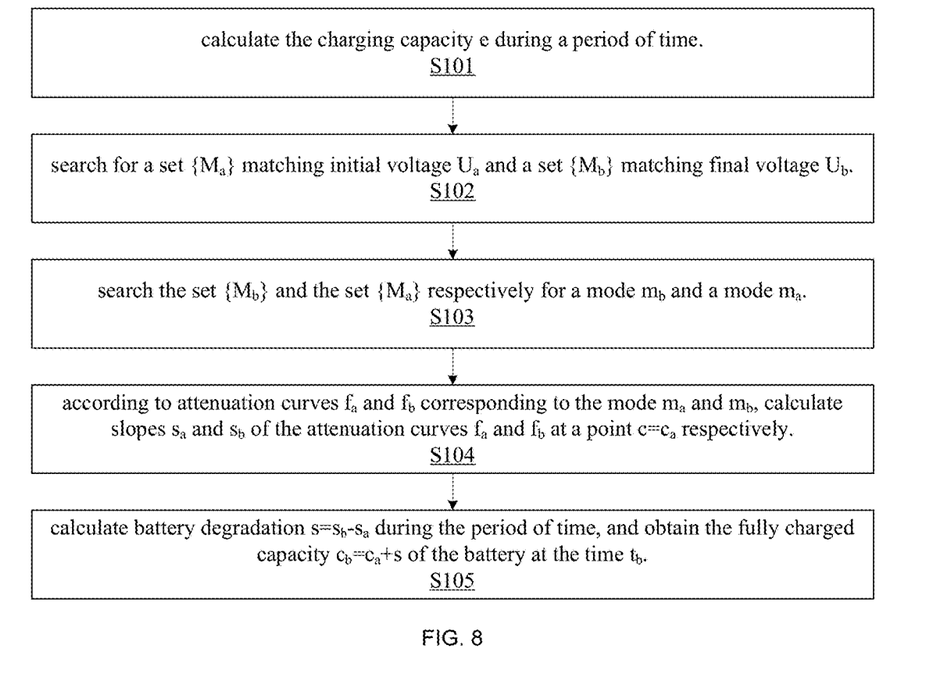
FIG. 8 is a flowchart showing a method for estimating a condition of a battery according an exemplary embodiment of the present invention.

For example, in the case that the identified usage mode is charging mode, the condition estimating unit 202 can execute the process as shown in FIG. 8, to calculate battery degradation according to charge level L, charging capacity δe, temperature T, initial charging voltage $U_a$ and final charging voltage $U_b$.

Firstly, in a step S101, calculate the charging capacity δe during the period of time according to the start time of charging $t_a$, end time of charging $t_b$ and charge current $I_c$ of the period of time.

Secondly, in a step S102, search all the mode tables for a set $\{M_a\}$ of all charging modes matching charge level L, initial charging voltage $U_a$ and temperature T, and a set $\{M_b\}$ of all charging modes matching charge level L, final charging voltage $U_b$ and temperature T.

Next, in a step S103, search the set $\{M_b\}$ and the set $\{M_a\}$ respectively for mode $m_b$ and mode $m_a$ such that a difference between the charging capacity of the mode $m_b$ and the charging capacity of the mode $m_a$ is equal to δe.

Then, in a step S104, according to attenuation curves $f_a$ and $f_b$ corresponding to the mode $m_a$ and $m_b$, calculate slopes $s_a$ and $s_b$ of the attenuation curves $f_a$ and $f_b$ at a point $c=c_a$ respectively, wherein $c_a$ represents a fully charged capacity of the battery at the time $t_a$, and $s_a$ and $s_b$ respectively represent degradation caused by charging the battery from the standard cut-off voltage to the initial charging voltage $U_a$ and the final charging voltage $U_b$ under the condition of the charge current $I_c$ and temperature T.

Finally, in a step S105, calculate battery degradation $s=s_b-s_a$ during the period of time, so as to obtain the fully charged capacity $c_b=c_a+s$ of the battery at the time $t_b$.

Figure 9:
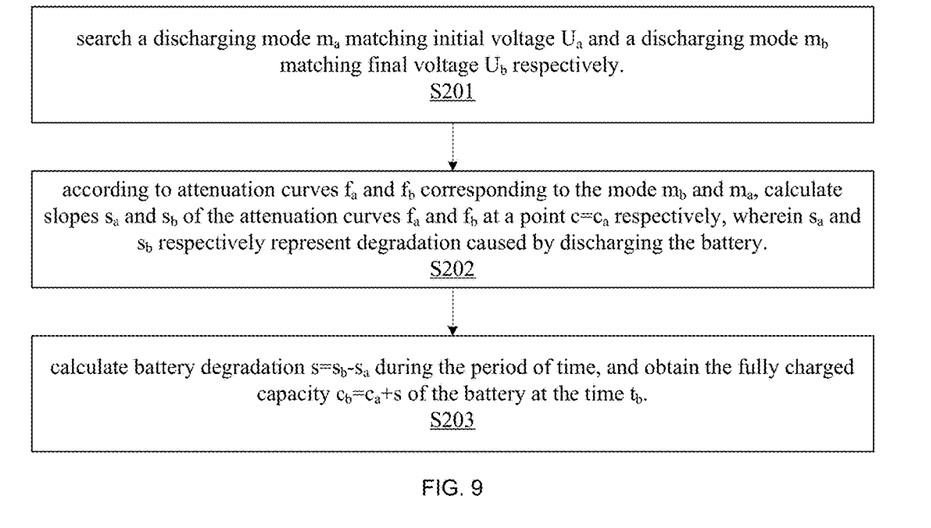
FIG. 9 is a flowchart showing a method for estimating a condition of a battery according an exemplary embodiment of the present invention.

On the other hand, in the case that the identified usage mode is discharging mode, the condition estimating unit 202 can make the process as shown in FIG. 9, to calculate battery degradation according to discharge current $I_d$, temperature T, initial charging voltage $U_a$ and final charging voltage $U_b$, wherein the degradation represents a quantity of the fully charged capacity of the battery that is reduced over the battery use.

Firstly, in a step S201, search the mode table for a discharging mode $m_a$ matching discharge current $I_d$, initial charging voltage $U_a$ and temperature T, and a discharging mode $m_b$ matching discharge current $I_d$, final charging voltage $U_b$ and temperature T.

Next, in a step S202, according to attenuation curves $f_a$ and $f_b$ corresponding to the mode $m_b$ and $m_a$, calculate slopes $s_a$ and $s_b$ of the attenuation curves $f_a$ and $f_b$ at a point $c=c_a$ respectively, wherein $s_a$ and $s_b$ respectively represent degradation caused by discharging the battery from the initial charging voltage $U_a$ and the final charging voltage $U_b$ to the standard cut-off voltage under the condition of the discharge current $I_d$ and temperature T.

Finally, in a step S203, calculate battery degradation $s=s_b-s_a$ during the period of time, so as to obtain the fully charged capacity $c_b=c_a+s$ of the battery at the time $t_b$.

Figure 10:
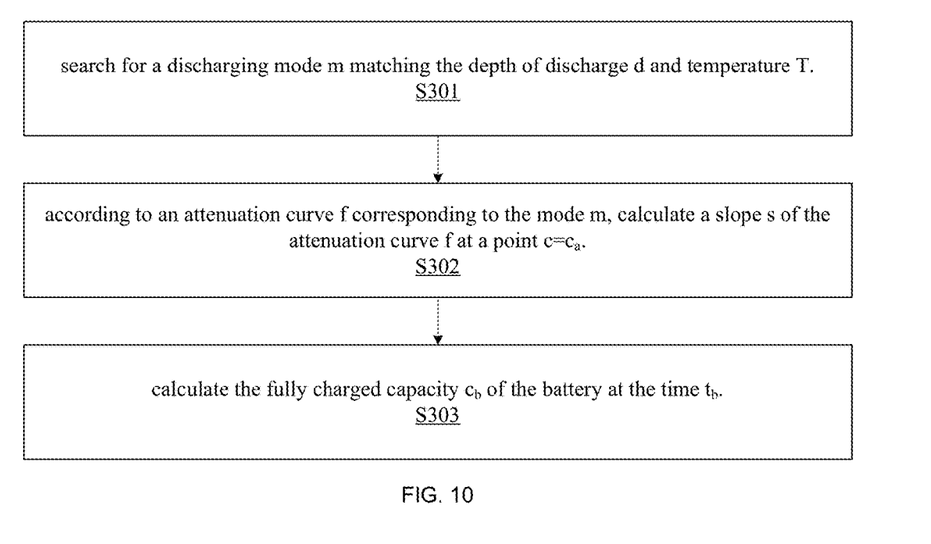
FIG. 10 is a flowchart showing a method for estimating a condition of a battery according an exemplary embodiment of the present invention.

However, in the case that the identified usage mode is idle mode, the condition estimating unit 202 can make the process as shown in FIG. 10, to calculate battery degradation according to depth of discharge d and temperature T, the degradation representing a quantity of the fully charged capacity of the battery that is reduced over the battery use.

Firstly, in a step S301, search the mode table for a discharging mode m matching the depth of discharge d and temperature T.

Next, in a step S302, according to an attenuation curve f corresponding to the mode m, calculate a slope s of the attenuation curve f at a point $c=c_a$, wherein s represents battery degradation during the period of time.

Finally, in a step S303, calculate the fully charged capacity $$c_b = c_a + s \cdot \frac{H}{H_0}$$

of the battery at the time $t_b$, where $H_0$ is the idle time used for establishing the mode m, and H is the idle time corresponding to the period of time.

Figure 11:
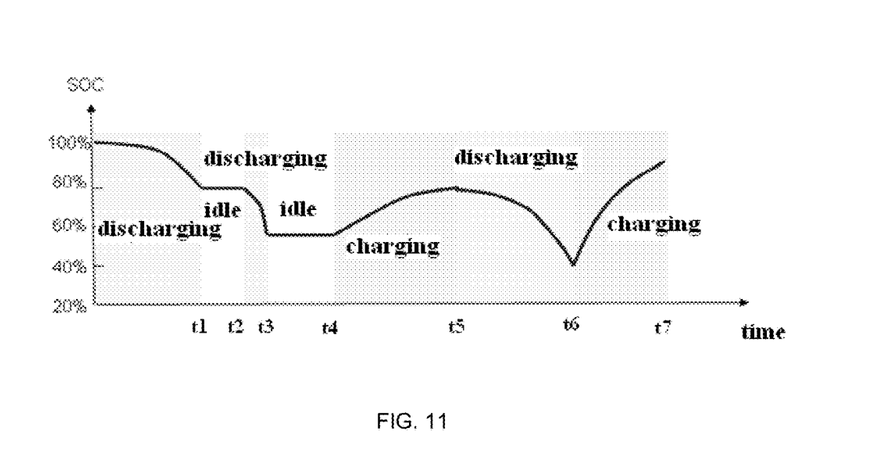
FIG. 11 illustratively shows multiple usage modes of a battery.

Exemplary embodiments for estimating a condition of the battery during a period of time have been described above. Consequently, in order to estimate a condition of the battery during a long period of time, the long period of time can be divided into a plurality of time segments according to the usage mode of the battery and the estimation is made in order according to the above-described way. For example, the battery usage can be divided into a plurality of usage modes corresponding to the plurality of time segments according to a change of a charge state of the battery with time. FIG. 11 shows various usage modes such as discharging, idle, discharging, idle, charging, discharging, charging in order. It can be seen that a different time segment corresponds to a different usage mode. Even for the discharging mode, the discharging mode during the time segment $t_2$-$t_3$ is different from the discharging mode during the time segment $t_5$-$t_6$, so different battery degradation occurs. By estimating the conditions of the battery in order, the battery degradation during a long period of time and the fully charged capacity of the battery after the long period of time can be obtained.

Figure 12:
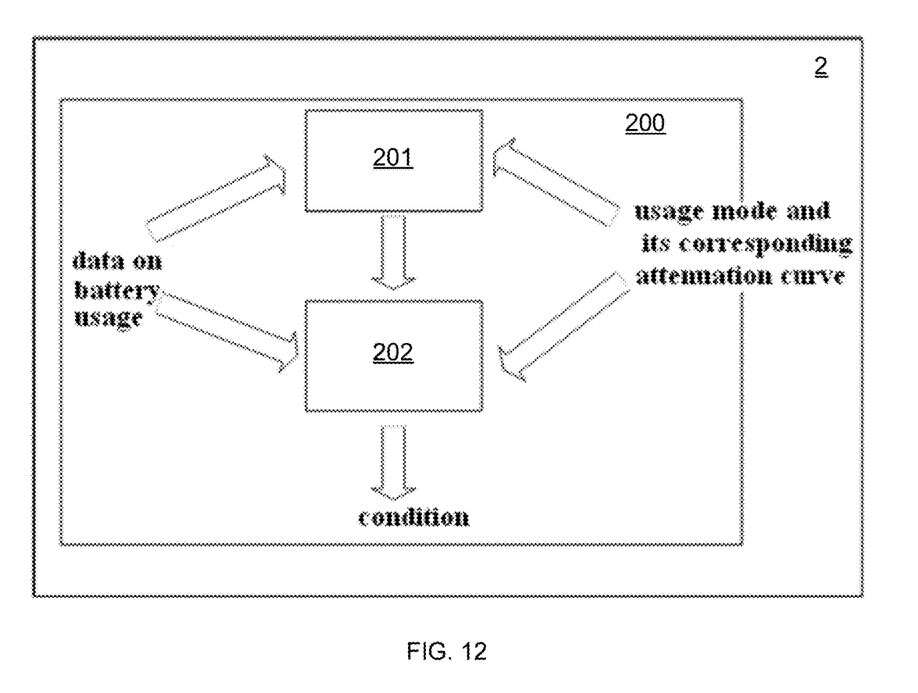
FIG. 12 is a block diagram showing a billing system according an exemplary embodiment of the present invention.

The condition estimating unit 202 can also calculate a rate of depreciation of once battery use $$D_r = \frac{C_a - C_b}{C_o - C_e}$$

according to the fully charged capacity of the battery obtained as above, where $c_e$ is a scrap capacity of the battery. Correspondingly, a depreciation expense of the battery can be estimated according to the rate of depreciation, so as to rationally judge its residual value in operation. For example, the depreciation expense $B_D$ of the battery can be defined as a product of battery price P and rate of depreciation $D_r$. The battery operator can rationally bill the user according to the depreciation expense of the battery in combination with an expense corresponding to battery charging/discharging capacity and related operating expenses. For example, according to an exemplary embodiment of the invention, a billing system 2 as shown in FIG. 12 is provided. The billing system 2 comprises the apparatus 200 for estimating a condition of a battery shown in FIG. 2. The billing system 2 can bill the electric vehicle charging in the charging station using the condition of the battery estimated by the apparatus 200 for estimating a condition of a battery, which overcomes the irrationality caused by billing by the current charging station without taking the condition of the battery into consideration.

Besides, while establishing the mode tables of the battery according to the experimental data, charging/discharging efficiencies in various usage modes can be recorded respectively, to establish an efficiency table in which charging mode, idle mode and discharging mode of the battery. Efficiencies corresponding to the usage modes may be stored. Charging efficiency, discharging efficiency and self-discharging efficiency in the idle mode can be defined as follows: the charging efficiency=(discharge current×time required to discharge to the cut-off voltage)/(charge current× charging time); the discharging efficiency=actual electricity energy discharged by discharging to the cut-off voltage/ nominal capacity; self-discharging efficiency=energy of the battery reduced by idle/total energy of the battery before idle.

The condition estimating unit 202 can calculate the remaining quantity of electricity energy of the battery according to the efficiency table. The remaining quantity of electricity energy of the battery can be obtained by accumulating a change value of the remaining quantity of electricity energy caused by battery use on the basis of the factory electricity energy $e_0$ of the battery.

For example, in the case that the identified usage mode is charging mode, the condition estimating unit 202 can calculate the remaining quantity of electricity energy as follows: calculating the charging capacity δe during the period of time according to start time $t_a$, end time $t_b$ and charge current $I_c$ of the period of time; searching the efficiency table for the charging mode and its corresponding charging efficiency α according to the data on battery usage recorded during the period of time; and calculating the remaining quantity of electricity energy $$e_b = e_a + \alpha \cdot \frac{C_a}{C_0} \cdot \delta e,$$

where $c_0$ is the factory capacity of the battery and ea is the remaining quantity of electricity energy of the battery at the time $t_a$.

On the other hand, in the case that the identified usage mode is discharging mode, the condition estimating unit 202 can calculate the remaining quantity of electricity energy as follows: calculating the discharging capacity δe during the period of time according to start time $t_a$, end time $t_b$ and discharge current $I_d$ of the period of time; searching the efficiency table for the discharging mode and its corresponding discharging efficiency β according to the data on battery usage recorded during the period of time; and calculating the remaining quantity of electricity energy $$e_b = e_a - \beta \cdot \frac{C_a}{C_0} \cdot \delta e.$$

However, in the case that the identified usage mode is idle mode, the condition estimating unit 202 can calculate the remaining quantity of electricity energy as follows: searching the efficiency table for the idle mode and its corresponding self-discharging efficiency γ according to the data on battery usage recorded during the period of time; and calculating the remaining quantity of electricity energy $$e_b = e_a \left(1 - \gamma \cdot \frac{C_a}{C_0} \cdot \frac{H}{H_\gamma}\right),$$

where $H_\gamma$ is the idle time corresponding to the self-discharging efficiency γ while establishing the efficiency table, and H is the idle time corresponding to the period of time.

Further, the following services can be provided to a driver of the electric vehicle according to the result of the remaining quantity of electricity energy of the battery; prompting a time that the battery can continue supplying power under the current driving condition, prompting a further driving distance under the current driving condition, etc.

Specifically, for example, calculate an average discharging rate and discharging efficiency in a unit time according to the current discharging mode of the battery, and then calculate power supplying time=(discharging efficiency)×(remaining quantity of electricity energy)/(average discharging rate). In combination with the time that the battery can continue supplying power and the driving speed of the vehicle, a further driving distance can be obtained.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   measuring and recording a set of data during a period of time including a charge level of a battery during the period of time and dividing the period of time into a plurality of time segments according to changes of a charge state of the battery with time;
   for each of the plurality of time segments in the period of time:
      determining a subset of data for that particular time segment including a charging capacity of the battery at an end of that particular time segment, a temperature of the battery during that particular time segment, and a final voltage of the battery at the end of that particular time segment;
      identifying a usage mode of the battery during that particular time segment by comparing the subset of data for that particular time segment to a plurality of stored usage modes of the battery;
      identifying an attenuation curve corresponding to the usage mode of the battery during that particular time segment, wherein the attenuation curve represents a change of a fully charged capacity of the battery over battery usage during that particular time segment for the usage mode; and
      calculating a degradation of the battery during that particular time segment based on the subset of data for that particular time segment;
   calculating a degradation of the battery according to the set of data over the period of time, the usage mode during each of the plurality of time segments, and the attenuation curves, the calculation being based on the degradation of the battery during each of the plurality of time segments calculated in order of the time segments, wherein the degradation represents a quantity of the fully charged capacity of the battery that is reduced over the battery usage during the period of time;
   recharging the battery by a charging station at the end of the period of time; and
   billing an adjusted amount to a user of the battery for an amount of electricity to recharge the battery by the charging station, the adjusted amount being determined based at least in part on a depreciation expense of the battery in combination with an expense to charge the battery, the depreciation expense being based on the degradation of the battery, such that a billed amount for recharging the battery decreases as the degradation of the battery progresses, the adjusted amount rationally representing a residual value of the battery for rational billing.

2. The method of claim 1, wherein the subset of data for each of the plurality of time segments in the period of time further comprises at least one of: a start time of the battery usage of that particular time segment, an end time of the battery usage of that particular time segment, an initial voltage of the battery usage of that particular time segment, a charge current during that particular time segment, a discharge current during that particular time segment, an idle time of that particular time segment, and a depth of discharge during that particular time segment, the depth of discharge representing a quantity of electricity energy of the battery before entering an idle mode.

3. The method of claim 2, wherein, in the case that the usage mode during that particular time segment is a charging mode, the degradation of the battery during that particular time segment is calculated according to a charge level L of that particular time segment, a charging capacity $\delta_e$ of that particular time segment, a temperature T during that particular time segment, an initial charging voltage $U_a$ of that particular time segment, and a final charging voltage $U_b$ of that particular time segment, the degradation of the battery being calculated by:
   calculating the charging capacity $\delta_e$, of that particular time segment according to a start time of charging $t_a$ of that particular time segment, an end time of charging $t_b$ of that particular time segment and a charge current $1_c$ of that particular time segment;
   searching stored charging modes of the battery and attenuation curves corresponding to the stored charging modes for a set $\{M_a\}$ of all charging modes of the stored charging modes that match the charge level L of that particular time segment, the initial charging voltage $U_a$ of that particular time segment and the temperature T during that particular time segment, and a set $\{M_b\}$ of all charging modes of the stored charging modes that match the charge level L of that particular time segment, the final charging voltage $U_b$ of that particular time segment, and the temperature T during that particular time segment;

searching the set $\{M_b\}$ and the set $\{M_a\}$ respectively for a mode mb for that particular time segment and a mode ma for that particular time segment such that a difference between a charging capacity of the mode mb and a charging capacity of the mode ma is equal to the charging capacity $\delta_e$ for that particular time segment;

according to attenuation curves $f_a$ and $f_b$ respectively corresponding to the mode $m_a$ of that particular time segment and the mode mb of that particular time segment, calculating slopes $s_a$ and $s_b$ respectively of the attenuation curves $f_a$ and $f_b$ at a point $c=c_a$, wherein $c_a$ represents a fully charged capacity of the battery at the start time of charging $t_a$ of that particular time segment, and slope $s_a$ and slope $s_b$ of that particular time segment respectively represent degradation of the battery during that particular time, the degradation being caused by charging the battery from a standard cutoff voltage to the initial charging voltage $U_a$ of that particular time segment and the final charging voltage $U_b$ of that particular time segment under a condition of the charge current $I_c$ of that particular time segment and the temperature T during that particular time segment; and calculating the degradation of the battery during that particular time segment as $s=s_b-s_a$, and obtaining the fully charged capacity of the battery at the end time of charging $t_b$ of that particular time segment as $c_b=c_a+s$.

4. The method of claim 3, further comprising:
calculating a rate of depreciation $D_r$ for that particular time segment, $$D_R = \frac{c_a - c_b}{c_o - c_e}$$

being caused by using the battery once, where $c_o$ is a factory capacity of the battery and $c_e$ is a scrap capacity of the battery.

5. The method of claim 3, further comprising:
calculating a remaining quantity of electricity energy of the battery for that particular time segment according to the plurality of stored usage modes of the battery and efficiencies corresponding to the plurality of stored usage modes, wherein the remaining quantity of electricity energy of the battery is obtained by accumulating changes of the remaining quantity of electricity energy of the battery caused by battery usage during that particular time segment on the basis of a factory electricity energy $e_o$ of the battery.

6. The method of claim 5, wherein, in the case that the usage mode during that particular time segment is a charging mode, the remaining quantity of electricity energy of the battery for that particular time segment is calculated by:
calculating the charging capacity $\delta_e$ of that particular time segment according to the start time of charging $t_a$ of that particular time segment, the end time of charging $t_b$ of that particular time segment and the charge current $I_c$ of that particular time segment;
searching the plurality of stored usage modes of the battery and efficiencies corresponding to the plurality of stored usage modes of the battery for a charging mode of that particular time segment and a charging efficiency $\alpha$ of that particular time segment, the charging efficiency $\alpha$ corresponding to the charging mode according to the subset of data for that particular time segment; and calculating the remaining quantity of electricity energy of the battery at the end time of charging $t_b$ of that particular time segment as $$e_b = e_a + \alpha \cdot \frac{c_a}{c_o} \cdot \delta e,$$

where $c_o$ is a factory capacity of the battery $e_a$ is the remaining quantity of electricity energy of the battery at the start time of charging $t_a$ of that particular time segment.

7. The method of claim 2, wherein in the case that the usage mode during that particular time segment is a discharging mode, the degradation of the battery during that particular time segment is calculated according to a discharge current $I_d$ of that particular time segment, a temperature T during that particular time segment, an initial discharging voltage $U_a$ of that particular time segment and a final discharging voltage $U_b$ of that particular time segment, the degradation of the battery being calculated by:
searching stored discharging modes of the battery and attenuation curves corresponding to the stored discharging modes for a discharging mode ma of that particular time segment matching the discharge current $I_d$ of that particular time segment, the initial discharging voltage $U_a$ of that particular time segment and the temperature T during that particular time segment, and a discharging mode mb of that particular time segment matching the discharge current $I_d$ of that particular time segment, a final discharging voltage $U_b$ of that particular time segment, and the temperature T during that particular time segment;

according to attenuation curves $f_a$ and $f_b$ respectively corresponding to the discharging mode ma of that particular time segment and the discharging mode $m_b$ of that particular time segment, calculating slopes $s_a$ and $s_b$ respectively of the attenuation curves $f_a$ and $f_b$ at a point $c=c_a$, wherein ca represents a fully charged capacity of the battery at a start time of discharging $t_a$ of that particular time segment, and the slope $s_a$ and the slope $s_b$ of that particular time segment respectively represent degradation of the battery caused by discharging the battery from the initial discharging voltage $U_a$ of that particular time segment and the final discharging voltage $U_b$ of that particular time segment to a standard cut-off voltage under a condition of the discharge current $I_d$ of that particular time segment and the temperature T during that particular time segment; and calculating the degradation of the battery during that particular time segment as $s=s_b-s_a$, and obtaining the fully charged capacity of the battery at an end time of discharging $t_b$ of that particular time segment as $c_b=c_a+s$.

8. The method of claim 2, wherein, in the case that the usage mode during that particular time segment is an idle mode, the degradation of the battery during that particular time segment is calculated according to a depth of discharge d during that particular time segment and a temperature T during that particular time segment, the degradation of the battery being calculated by:
searching stored idle modes of the battery and attenuation curves corresponding to the stored idle modes for a discharging mode m of that particular time segment, the discharging mode matching the depth of discharge d and the temperature T during that particular time segment;

according to an attenuation curve f corresponding to the discharging mode m of that particular time segment, calculating a slope s of the attenuation curve f at a point $c=c_a$ wherein $c_a$ represents a fully charged capacity of the battery at a start time of the idle mode $t_a$ during that particular time segment, and s represents degradation of the battery during that particular time segment; and calculating the fully charged capacity of the battery at the end time of the idle mode $t_b$ of that particular time segment as $$c_b = c_a + s * \frac{H}{H_o},$$

where $H_o$ is an idle time used for establishing the discharging mode m of that particular time segment, and H is an idle time corresponding to that particular time segment.

9. The method of claim 1, wherein, in the case that the usage mode during that particular time segment is a discharging mode, a remaining quantity of electricity energy of the battery during that particular time segment is calculated by:

calculating a discharging capacity $\delta_e$ of that particular time segment according to a start time of discharging $t_a$ of that particular time segment, an end time of discharging $t_b$ of that particular time segment;

searching the plurality of stored usage modes of the battery and efficiencies corresponding to the plurality of stored usage modes of the battery for the discharging mode and a discharging efficiency ~ of that particular time segment, the discharging efficiency β corresponding to the discharging mode during that particular time segment according to the subset of data for that particular time segment; and calculating the remaining quantity of electricity energy of the battery at the end time of discharging $t_b$ of that particular time segment as $$e_b = e_a - \beta \cdot \frac{c_a}{c_o} \cdot \delta e,$$

where $c_o$ is a factory capacity of the battery and $e_a$ is the remaining quantity of electricity energy of the battery at the start time of discharging $t_a$ of that particular time segment.

10. The method of claim 1, wherein, in the case that the usage mode during that particular time segment is an idle mode, a remaining quantity of electricity energy of the battery during that particular time segment is calculated as follows by:

searching the plurality of stored usage modes of battery and efficiencies corresponding to the plurality of stored usage modes of the battery for the idle mode and a self-discharging efficiency γ of that particular time segment, the self-discharging efficiency γ corresponding to the idle mode according to the subset of data for that particular time segment; and calculating the remaining quantity of electricity energy of the battery at an end time of the idle mode $t_b$ of that particular time segment as $$e_b = \left(1 - \gamma \cdot \frac{c_a}{c_o} \cdot \frac{H}{H_\gamma}\right),$$

where $c_o$ is a factory capacity of the battery, $e_a$ is the remaining quantity of electricity energy of the battery at a start time of the idle mode $t_a$ of that particular time segment, Hγ is an idle time corresponding to the self-discharging efficiency γ of that particular time segment while establishing an efficiency table, and H is an idle time corresponding to that particular time segment.

11. An apparatus for billing for recharging based on a condition of a battery, comprising:

a mode identifying unit for recording a set of data for a period of time including a charge level of a battery during the period of time and dividing the period of time into a plurality of time segments according to changes of a charge state of the battery with time, for each of the plurality of time segments in the period of time:

determining a subset of data for that particular time segment including a charging capacity of the battery at an end of that particular time segment, a temperature of the battery during that particular time segment, and a final voltage of the battery at the end of that particular time segment;

determining a usage mode of the battery during that particular time segment by comparing the subset of data for that particular time segment to a plurality of stored usage modes of the battery;

determining an attenuation curve corresponding to the usage mode of the battery during that particular time segment, wherein the attenuation curve represents a change of a fully charged capacity of the battery over battery usage for the usage mode during that particular time segment; and calculating a degradation of the battery during that particular time segment based on the subset of data for that particular time segment; and a condition estimating unit configured for calculating a degradation of the battery according to the set of data over the period of time, the usage mode during each of the plurality of time segments, and the attenuation curves, the calculation based on the degradation of the battery during each of the plurality of time segments calculated in order of the time segments, wherein the degradation represents a quantity of the fully charged capacity of the battery that is reduced over the battery usage during the period of time, and for billing an adjusted amount to a user of the battery for an amount of electricity to recharge the battery using a charging station, the adjusted amount being determined based at least in part on a depreciation expense of the battery in combination with an expense to recharge the battery, the depreciation expense being based on the degradation of the battery, such that a billed amount for recharging the battery decreases as the degradation of the battery progresses, the adjusted amount rationally representing a residual value of the battery for rational billing.

12. The apparatus of claim 11, wherein the subset of data for each of the plurality of time segments in the period of time further comprises at least one of: a start time of the battery usage of that particular time segment, an end time of the battery usage of that particular time segment, an initial voltage of the battery usage of that particular time segment, a charge current during that particular time segment, a discharge current during that particular time segment, an idle time of that particular time segment, and a depth of discharge during that particular time segment, the depth of discharge representing a quantity of electricity energy of the battery before entering an idle mode.

13. The apparatus of claim 12, wherein, in the case that the usage mode during that particular time segment is a charging mode, the degradation of the battery during that particular time segment is calculated according to a charge level L of that particular time segment, a charging capacity $\delta_e$ of that particular time segment, a temperature T during that particular time segment, an initial charging voltage $U_a$ of that particular time segment and a final charging voltage $U_b$ of that particular time segment, the degradation of the battery being calculated by:
  calculating the charging capacity $\delta_e$ of that particular time segment according to a start time of charging $t_a$ of that particular time segment, an end time of charging $t_b$ of that particular time segment and a charge current $I_c$ of that particular time segment;
  searching stored charging modes of the battery and attenuation curves corresponding to the stored charging modes for a set $\{M_a\}$ of all charging modes of the stored charging modes that match the charge level L of that particular time segment, the initial charging voltage $U_a$ of that particular time segment and the temperature T during that particular time segment, and a set $\{M_b\}$ of all charging modes of the stored charging modes that match the charge level L of that particular time segment, the final charging voltage $U_b$ of that particular time segment and the temperature T during that particular time segment;
  searching the set $\{M_b\}$ and the set $\{M_a\}$ respectively for a mode mb for that particular time segment and a mode $m_a$ for that particular time segment such that a difference between a charging capacity of the mode mb and a charging capacity of the mode $m_a$ is equal to the charging capacity $\delta_e$ for that particular time segment;
  according to attenuation curves $f_a$ and $f_b$ respectively corresponding to the mode $m_a$ of that particular time segment and the mode mb of that particular time segment, calculating slopes $s_a$ and $s_b$ respectively of the attenuation curves $f_a$ and $f_b$ at a point $c=c_a$, wherein $c_a$ represents a fully charged capacity of the battery at the start time of charging $t_a$ of that particular time segment, and slope $s_a$ and slope $s_b$ of that particular time segment respectively represent degradation of the battery during that particular time segment, the degradation being caused by charging the battery from a standard cut-off voltage to the initial charging voltage $U_a$ of that particular time segment and the final charging voltage $U_b$ of that particular time segment under a condition of the charge current $I_c$ of that particular time segment and the temperature T during that particular time segment; and
  calculating degradation of the battery during that particular time segment as $s=s_b-s_a$, and obtaining the fully charged capacity of the battery at the end time of charging $t_b$ of that particular time segment as $c_b=c_a+s$.

14. The apparatus of claim 13, further comprising:
  calculating a rate of depreciation $D_r$ for that particular time segment, $$D_r = \frac{c_a - c_b}{c_o - c_e}$$

being caused by using the battery once, where $c_o$ is a factory capacity of the battery and $c_e$ is a scrap capacity of the battery.

15. The apparatus of claim 13, further comprising:
  calculating a remaining quantity of electricity energy of the battery for that particular time segment according to the plurality of stored usage modes of the battery and efficiencies corresponding to the plurality of stored usage modes, wherein the remaining quantity of electricity energy of the battery is obtained by accumulating changes of the remaining quantity of electricity energy of the battery caused by battery usage during that particular time segment on a basis of a factory electricity energy eo of the battery.

16. The apparatus of claim 15, wherein, in the case that the usage mode during that particular time segment is a charging mode, the remaining quantity of electricity energy of the battery during that particular time segment is calculated by:
  calculating the charging capacity $\delta_e$ of that particular time segment during the period of time according to the start time of charging $t_a$ of that particular time segment, the end time of charging $t_b$ of that particular time segment and the charge current $I_c$ of that particular time segment;
  searching the plurality of stored usage modes of the battery and efficiencies corresponding to the plurality of stored usage modes of the battery for a charging mode of that particular time segment and a charging efficiency α of that particular time segment, the charging efficiency α corresponding to the charging mode according to the subset of data for that particular time segment; and
  calculating the remaining quantity of electricity energy of the battery at the end time of charging $t_b$ of that particular time segment as $$e_b = e_a + \alpha \cdot \frac{c_a}{c_o} \cdot \delta e,$$

where $c_o$ is a factory capacity of the battery and $e_a$ is the remaining quantity of electricity energy of the battery at the start time of charging $t_a$ of that particular time segment.

17. The apparatus of claim 12, wherein in the case that the usage mode during that particular time segment is a discharging mode, the degradation of the battery during that particular time segment is calculated according to a discharge current $I_d$ of that particular time segment, a temperature T during that particular time segment, an initial discharging voltage $U_a$ of that particular time segment and a final discharging voltage $U_b$ of that particular time segment, the degradation of the battery being calculated by:
  searching stored discharging modes of the battery and attenuation curves corresponding to the stored discharging modes for a discharging mode ma of that particular time segment matching the discharge current $I_d$ of that particular time segment, the initial discharging voltage $U_a$ of that particular time segment and the temperature T during that particular time segment, and a discharging mode $m_b$ of that particular time segment matching the discharge current $I_d$ of that particular time segment, a final discharging voltage $U_b$ of that particular time segment, and the temperature T during that particular time segment;

according to attenuation curves fa and fb respectively corresponding to the discharging mode $m_a$ of that particular time segment and the discharging mode $m_b$ of that particular time segment, calculating slopes $s_a$ and $s_b$ respectively of the attenuation curves $f_a$ and $f_b$ at a point $c=c_a$, wherein $c_a$ represents a fully charged capacity of the battery at a start time of discharging $t_a$ of that particular time segment, and the slope $s_a$ and the slope $s_b$ of that particular time segment respectively represent degradation of the battery caused by discharging the battery from the initial discharging voltage $U_a$ of that particular time segment and the final discharging voltage $U_b$ of that particular time segment to a standard cut-off voltage under a condition of the discharge current $I_d$ of that particular time segment and the temperature T during that particular time segment; and calculating degradation of the battery during that particular time segment as $s=s_b-s_a$, and obtaining the fully charged capacity of the battery at an end time of discharging $t_b$ of that particular time segment as $c_b=c_a+s$.

18. The apparatus of claim 12, wherein, in the case that the usage mode during that particular time segment is an idle mode, the degradation of the battery during that particular time segment is calculated according to a depth of discharge d during that particular time segment and a temperature T during that particular time segment, the degradation of the battery being calculated as follows:

searching stored idle modes of the battery and attenuation curves corresponding to the stored idle modes for a discharging mode m of that particular time segment, the discharging mode m matching the depth of discharged discharge d and the temperature T during that particular time segment;

according to an attenuation curve f corresponding to the discharging mode m of that particular time segment, calculating a slope s of the attenuation curve f at a point $c=c_a$, wherein $c_a$ represents a fully charged capacity of the battery at a start time of the idle mode $t_a$ during that particular time segment, and s represents degradation of the battery during that particular time segment; and calculating the fully charged capacity of the battery at the end time of the idle mode $t_b$ of that particular time segment as $$c_b = c_a + s \cdot \frac{H}{H_o},$$

where $H_o$ is an idle time used for establishing the discharging mode m of that particular time segment, and H is an idle time corresponding to that particular time segment.

19. The apparatus of claim 11, wherein, in the case that the usage mode during that particular time segment is a discharging mode, a remaining quantity of electricity energy of the battery during that particular time segment is calculated by:

calculating a discharging capacity $\delta_e$ of that particular time segment according to a start time of discharging $t_a$ of that particular time segment, an end time of discharging $t_b$ of that particular time segment and a discharge current $I_d$ of that particular time segment;

searching the plurality of stored usage modes of the battery and efficiencies corresponding to the plurality of stored usage modes of the battery for the discharging mode and a discharging efficiency $\beta$ of that particular time segment, the discharging efficiency $\beta$ corresponding to the discharging mode according to the subset of data for that particular time segment; and calculating the remaining quantity of electricity energy of the battery at the end time of discharging $t_b$ of that particular time segment as $$e_b = e_a - \beta \cdot \frac{c_a}{c_o} \cdot \delta e$$

where $c_o$ is a factory capacity of the battery and $e_a$ is the remaining quantity of electricity energy of the battery at the start time of discharging $t_a$ of that particular time segment.

20. The apparatus of claim 11, wherein, in the case that the usage mode during that particular time segment is an idle mode, a remaining quantity of electricity energy of the battery during that particular time segment is calculated by:

searching the plurality of stored usage modes of battery and efficiencies corresponding to the plurality of stored usage modes of the battery for the idle mode and a self-discharging efficiency $\gamma$ of that particular time segment, the self-discharging efficiency $\gamma$ corresponding to the idle mode according to the subset of data for that particular time segment; and calculating the remaining quantity of electricity energy of the battery at an end time of the idle mode $t_b$ of that particular time segment as $$e_b = e_a\left(1 - \gamma \cdot \frac{c_a}{c_o} \cdot \frac{H}{H_\gamma}\right)$$

where $c_o$ is a factory capacity of the battery, $e_a$ is the remaining quantity of electricity energy of the battery at a start time of the idle mode $t_a$ of that particular time segment, $H_\gamma$ is an idle time corresponding to the self-discharging efficiency $\gamma$ while establishing an efficiency table, and H is an idle time corresponding to that particular time segment.

* * * * *